US 6,641,025 B2

(12) United States Patent
Stilwell et al.

(10) Patent No.: US 6,641,025 B2
(45) Date of Patent: Nov. 4, 2003

(54) THREADING TOOL AND METHOD FOR BOND WIRE CAPILLARY TUBES

(75) Inventors: Michael Stilwell, Nampa, ID (US); Daniel A. Pfankuch, Nampa, ID (US); John Tucker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 09/944,901

(22) Filed: Aug. 30, 2001

(65) Prior Publication Data

US 2003/0042296 A1 Mar. 6, 2003

(51) Int. Cl.[7] .............................................. B23K 37/00
(52) U.S. Cl. ............................. 228/4.5; 228/45; 228/57
(58) Field of Search ........................... 228/4.5, 45, 57, 228/904; 33/626, DIG. 13; 254/134.3 R; 294/132; 72/419, 422, 426; 227/107

(56) References Cited

U.S. PATENT DOCUMENTS

| | | | | |
|---|---|---|---|---|
| 5,906,706 A | * | 5/1999 | Farassat | 156/580.1 |
| 6,100,511 A | * | 8/2000 | Kempe | 219/679 |
| 6,206,275 B1 | * | 3/2001 | Biggs | 228/180.5 |
| 6,318,704 B1 | * | 11/2001 | Christenson | 254/134.3 R |
| 6,502,738 B2 | * | 1/2003 | Mochida et al. | 228/4.5 |

* cited by examiner

Primary Examiner—Tom Dunn
Assistant Examiner—Colleen P. Cooke
(74) Attorney, Agent, or Firm—Dorsey & Whitney LLP

(57) ABSTRACT

A capillary threading tool is used to thread bond wire through the capillary tool of a wire bond machine. The capillary threading tool includes a handle that is grasped to manipulate a body portion into a gap between the upper end of the capillary tube and the lower end of a guide tube that is positioned above the capillary tube. The body portion includes a guide surface that is placed in contact with the wire bond machine, and a vertical slot extending from the guide surface that terminates in a closed end having an inclined surface. The length of the slot is selected to position the lower edge of the inclined surface above the end of the capillary tube so the bond wire can be threaded into the capillary tube simply by forcing the end of the wire on the inclined surface.

12 Claims, 4 Drawing Sheets

THREADING TOOL AND METHOD FOR BOND WIRE CAPILLARY TUBES

TECHNICAL FIELD

This invention relates to integrated circuit fabrication, and, more particularly, to a method and tool to facilitate threading integrated circuit bond wires through capillary tubes in wire bond machines.

BACKGROUND OF THE INVENTION

Wire bond machines are typically used to attach bond wires between bond pads fabricated on integrated circuit dies and leadframes through which signals and power are routed to and from the integrated circuit. A typical wire bond machine 10 is shown in FIG. 1. The wire bond machine 10 includes a spool 12 of bond wire 14, which is typically gold wire having a diameter of about 1 mil ($10^{-3}$ inches). The wire 14 extends over a diverter 20 and passes through a housing 22 containing a sensor 24 and an air guide 26. The sensor 24 and air guide 26 cooperate with each other in a conventional manner to draw the wire 14 from the spool 12 and maintain the wire 14 at the proper tension. The wire 14 then extends downwardly and passes through a nozzle 30 having a relatively large diameter to a guide tube 34, which also has a relatively large diameter. The guide tube 34 has a flared upper end 36 that facilitates the threading of the wire 14 into the tube 34. The wire 14 then extends through a gap 38, typically 0.5–1.0 inches wide, and passes through a capillary tube. The capillary tube 40 typically has a diameter of about 3.0–3.5 mils. The capillary tube 40 is attached by a clamp 44, to a transducer that produces ultrasonic force.

In operation, it is occasionally necessary to thread the bond wire 14 from the spool 12 to the capillary tube 40 such as, for example, if the supply of wire 14 from the spool 12 has been exhausted or the wire 14 breaks. Threading the wire 14 over the diverter 20 and through the housing 22 is fairly easy. Threading the wire 14 through the nozzle 30 and guide tube 34 is somewhat more difficult, but because of the relatively large diameters of the nozzle 30 and guide tube 34, can generally be accomplished by a skilled operator fairly easily in relatively little time. However, it is substantially more difficult to thread the wire 14 into an end 48 in the capillary tube 40 because of the relatively small diameter of the capillary tube 40. The guide tube 34 is somewhat effective in guiding the wire 14 to the general vicinity of the end 48 of the capillary tube 40, but, because of the gap 34, the wire 14 is easily deflected from the entrance to the capillary tube 40. For example, there may be air currents present that, although slight, are sufficient to deflect the wire 14 away from the end 48 of the capillary tube 40. Even the breath of an operator threading the wire 14 can be sufficient to deflect the wire 14 away from the end 48 of the capillary tube 40. As a result, it is invariably necessary for the operator to manually guide the wire 14 into the end 48 of the capillary tube 40.

The operator typically guides the wire 14 into the end 48 of the capillary tube 40 by grasping the wire 14 with a tweezers (not shown) while viewing the end of the wire 14 through a magnifier (not shown), such as a microscope (not shown). Successfully guiding the wire 14 into the end 48 of the capillary tube 40 in this manner requires a great deal of skill and manual dexterity, and usually requires a great deal of time. During the time the operator is threading the wire 14 through the capillary tube 40, the bond machine 10 may not be used for fabricating integrated circuits. The difficulty in threading the wire 14 through the capillary tube 40 not only results in excessive down-time of the bond machine 10, but may also cause excessive down-time of an integrated circuit fabrication line in which the wire bond machine 10 is used. Further, the skill required to manually thread the wire 14 through the capillary tube 40 reduces the availability of operators capable of operating the wire bond machine 10 and, because manually dexterity and vision may decline with age, may shorten the careers of such operators.

There is therefore a need for a device and method to facilitate the threading of bond wires through capillary tubes, thus reducing the time and skill level required to thread bond wires through a bond machine.

SUMMARY OF THE INVENTION

A capillary threading tool is used with a wire bond machine to thread bond wire in though a capillary tube positioned below a guide tube by a gap. The capillary threading tool includes a handle connected to a body portion that is inserted into the gap. The body portion includes a slot through which the bond wire passes between the guide tube and capillary tube. The slot has first and second portions separated from each other along the length of the bond wire. The first portion of the slot has a width that is smaller than the outside diameter of the capillary tube, and the second portion of the slot has a width that is approximately equal to the outside diameter of the capillary tube. The body portion is placed in the gap with the capillary tube inserted into the second portion of the slot beneath the first portion of the slot so that the first portion of the slot substantially fills the gap. The first and second portions of the slot terminate in respective first and second slot ends that are substantially aligned with each other. The capillary tube is placed against the end of the second portion of the slot to align the end of the first portion of the slot with the capillary tube. As a result, the end of the first portion can be used to guide the bond wire into the capillary tube.

DETAILED DESCRIPTION OF THE INVENTION

Figure 2:
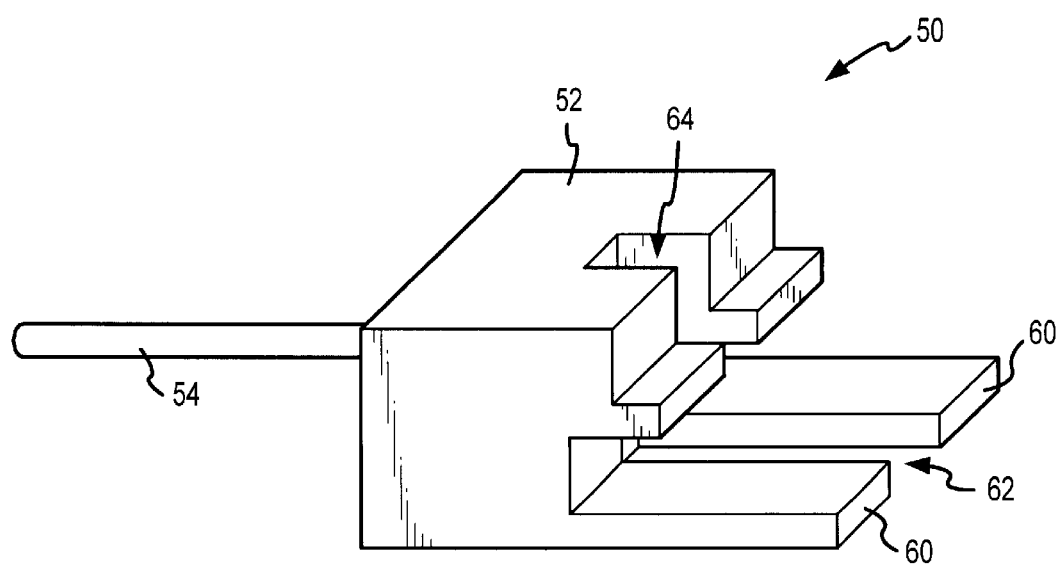
FIG. 2 is an isometric view of a capillary threading tool according to one embodiment of the invention.

One embodiment of a capillary threading tool 50 for guiding bond wires 14 into capillary tubes 40 according to the present invention is shown in FIG. 2. The capillary threading tool 50 includes a body portion 52 from which a cylindrical handle 54 projects. The body portion 52 includes a first guide surface 60, a horizontal slot 62, and a vertical slot 64.

Figure 3:
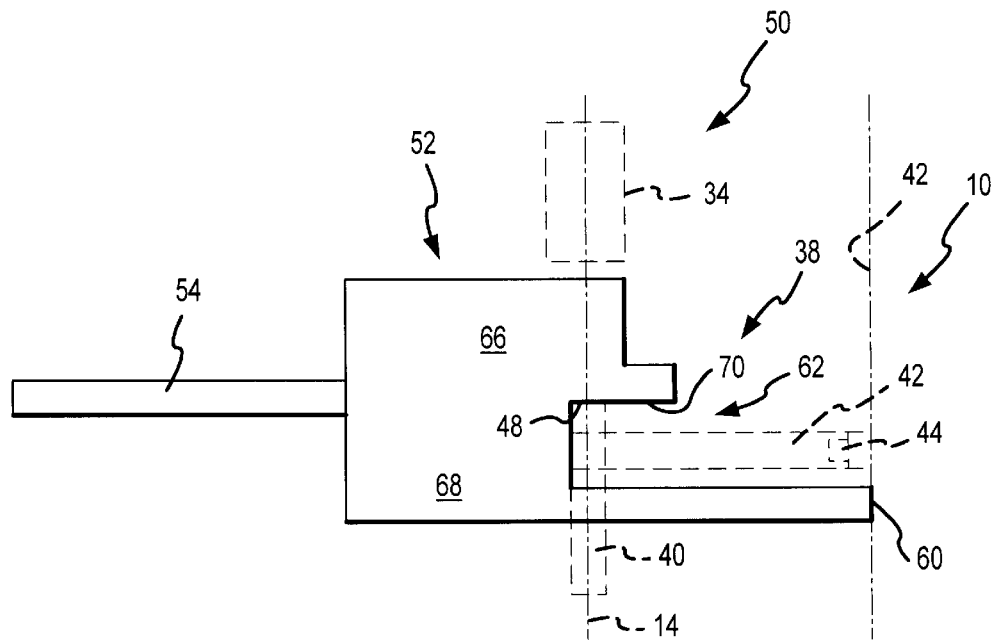
FIG. 3 is a side elevational view showing the capillary threading tool of FIG. 2 in use on a wire bond machine.
Figure 4:
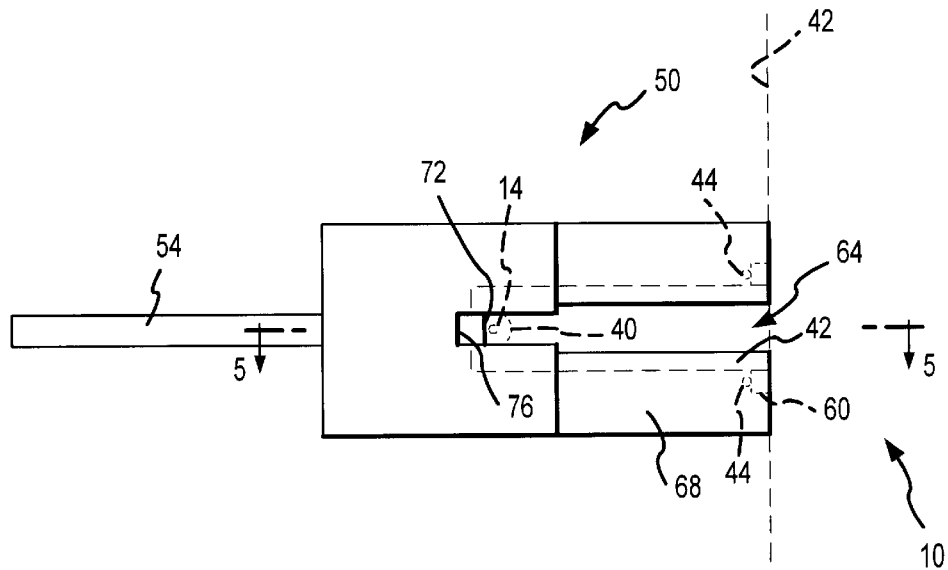
FIG. 4 is a top plan view showing the capillary threading tool of FIG. 2 in use on a wire bond machine.

The capillary threading tool 50 is shown in use with the wire bond machine 10 in FIGS. 3 and 4. The capillary threading tool 50 is manipulated by grasping the handle 54 to insert the tool 50 into the gap 38 between the capillary tube 40 and the guide tube 34. As best shown in FIG. 3, the horizontal slot 62 provides clearance for the clamp 42 and bolts 44 that secure the capillary tube 40 to the wire bond machine 10. The horizontal slot 62 also divides the body portion 52, as well as the vertical slot 64, into a first, upper portion 66 and a second, lower portion 68. As best shown in FIG. 4, the vertical slot 64 provides a removal path for the bond wire 14 to allow the capillary threading tool 50 to be removed after the bond wire 14 has been threaded through the capillary tube 40. The lower portion 68 of vertical slot 64 preferably has a width that is just slightly larger than an outer diameter of the capillary tube 40 so that the lower portion 68 of the vertical slot 64 can straddle the capillary tube 40. The lower portion 68 of the vertical slot 64 can therefore fixes the transverse position of the body portion 52 relative to the capillary tube 40.

Figure 1:
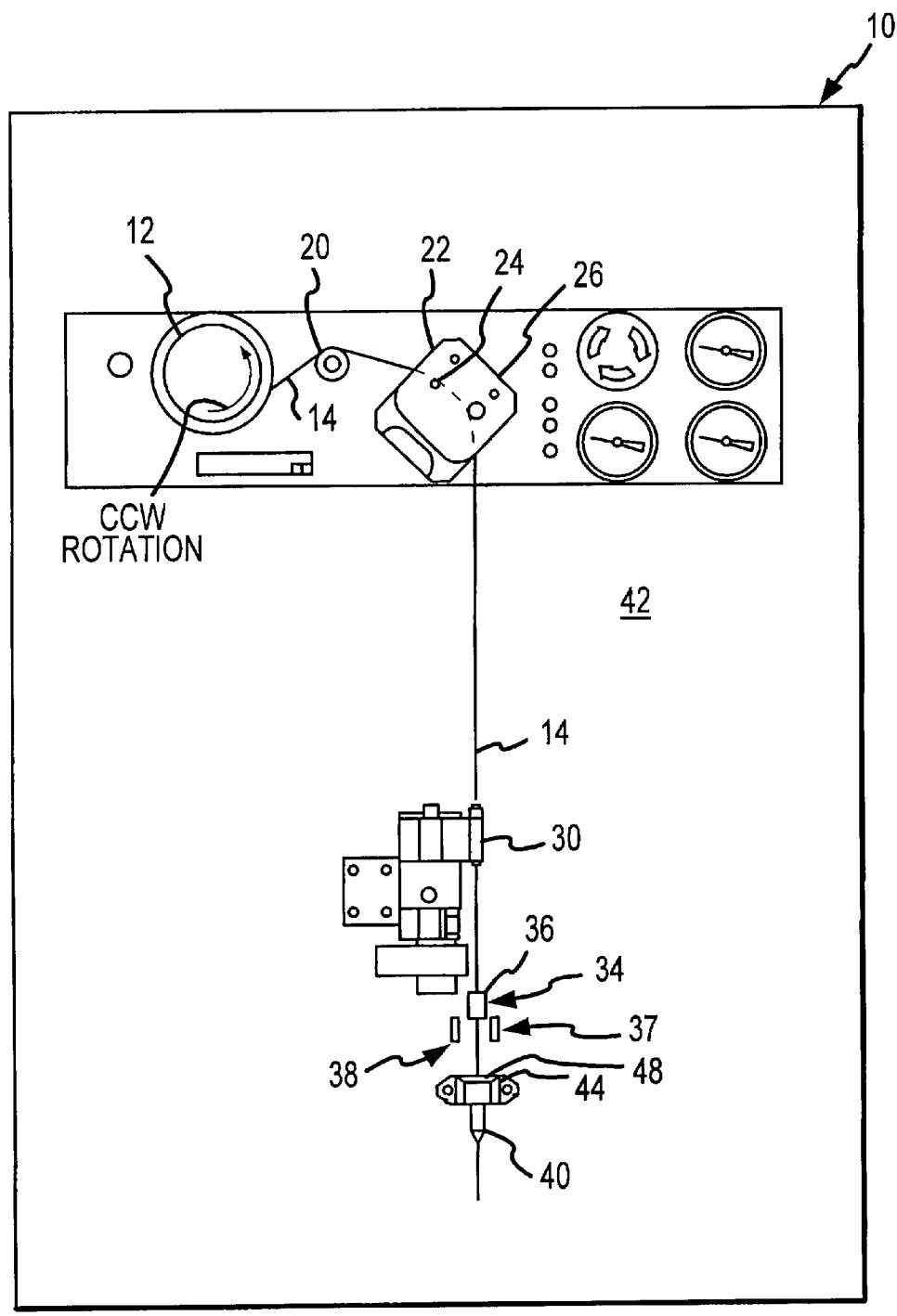
FIG. 1 is a schematic view of a conventional wire bond machine.

The upper portion 66 of vertical slot 64 preferably has a width that is smaller than an outer diameter of the capillary tube 40. As a result, a second guide surface 70 formed by the upper surface of the horizontal slot 62, i.e., the surface beneath the upper portion 66 of the vertical slot 64, rests against the end 48 of the capillary tube 40. The second guide surface 70 thus fixes the vertical position of the body portion 52 relative to the capillary tube 40. The height of the upper portion of the body portion 52 preferably corresponds to the size of the gap 38 (FIG. 1) between the guide tube 34 and the capillary tube 40 so that there is no significant gap between the body portion 52 and the guide tube 34.

The position of the body portion 52 relative to the capillary tube 40 along the length of the vertical slot 64 should also be fixed to accurately guide the bond wire 14 into the end 48 of the capillary tube 40. In one embodiment, the distance between the first guide surface 60 and a closed end 72 of the upper portion 66 of the vertical slot 64 corresponds to the distance between the front panel 42 of the wire bond machine 10 and the capillary tube 40. As a result, when the first guide surface 60 is placed in contact with the front panel 42 of the bond machine 10, the closed end 72 of the slot 64 is substantially aligned with the capillary tube 40. In another embodiment, a third guide surface 76 formed at a closed end of the lower portion 68 of the vertical slot 64 is positioned so the capillary tube 40 will be aligned with the closed end 72 when the capillary tube 40 is placed in contact with the third guide surface 76. Therefore, either the first guide surface 50 or the third guide surface 76 fixes the position of the body portion 52 of the capillary threading tool 50 along a longitudinal axis toward-and-away from the wire bond machine 10.

Figure 5:
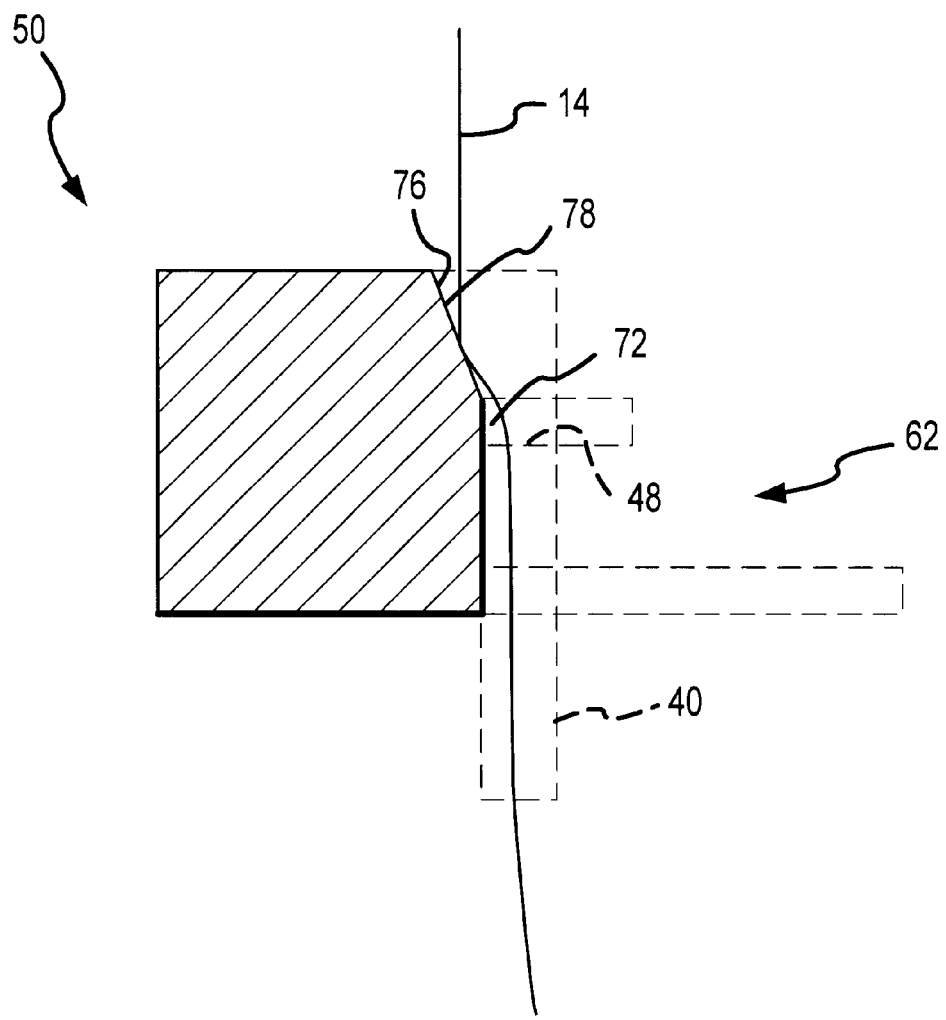
FIG. 5 is a cross-sectional view taken along the line 5—5 of FIG. 3.

By fixing the closed end 72 of the vertical slot 64 so that it is in substantial alignment with the end 48 of the capillary tube 40, the closed end 72 can be used to guide the bond wire 14 into the end 48 of the capillary tube 40 by simply guiding the wire 14 into the guide tube 34. The bond wire 14 then exits the guide the guide tube 34 at the closed end 72 of the vertical slot 64 and is then directed into the capillary tube 40. To further facilitate the proper positioning of the bond wire 14 along the length of the vertical slot 64 an inclined surface 78 is formed at the closed end 72, as best shown in FIG. 5. As a result, it is only necessary to manipulate an end of the bond wire 14 so that it is positioned at some point on the inclined surface 78. The vertical slot 64 and the inclined surface 78 then guide the wire 14 into the end 48 of the capillary tube 40.

The capillary threading tool 50 allows even relatively unskilled operators of the wire bond machine 10 to easily and quickly thread the bond wire 14 through the capillary tube 40. Although specific structures for the wire bond machine 10 and the capillary threading tool 50 have been shown in FIGS. 1–5, it will be understood that a capillary threading tool according to the invention can be used with other wire bond machines, and doing so may require some alteration of the size, shape and components of the capillary threading tool 50 shown in FIGS. 2–5. Therefore, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A capillary threading tool for use with a wire bond machine having a capillary tube positioned below a guide tube, the capillary threading tube comprising:
    a handle; and
    a body portion connected to the handle, the body portion having formed therein a first slot lying in a plane formed by first and second orthogonal axes, the first slot having first and second portions separated from each other along the first axis, the first portion of the first slot having a width that is smaller than an outside diameter of the capillary tube, and the second portion of the first slot having a width that is at least as large as the outside diameter of the capillary tube, the first portion of the first slot having a dimension along the first axis that is less than a distance between the guide tube and the capillary tube.

2. The capillary threading tool of claim 1 further comprising an inclined surface formed at an end of the first portion of the first slot, the inclined surface sloping inwardly from the end of the first portion of the first slot.

3. The capillary threading tool of claim 2 wherein the inclined surface comprises an inclined plane.

4. The capillary threading tool of claim 1 wherein the wire bond machine further comprises a vertical surface positioned adjacent to the capillary tube a first distance from the capillary tube, and wherein the first portion of the first slot has a depth extending from a first surface of the body portion to a slot end that is substantially equal to the first distance.

5. The capillary threading tool of claim 1 wherein the wire bond machine further comprises a vertical surface positioned adjacent to the capillary tube, and wherein the first portion of the first slot has a depth selected so that when a first surface of the body portion is placed in contact with the vertical surface of the wire bond machine, a slot end of the first portion of the first slot is positioned in substantial alignment with the capillary tube.

6. The capillary threading tool of claim 1 further comprising a second notch extending through the body portion perpendicularly to the first slot between the first and second portions of the first slot.

7. The capillary threading tool of claim 1 wherein the width of the second portion of the first slot is substantially equal to the outside diameter of the capillary tube.

8. The capillary threading tool of claim 1 wherein the first portion of the first slot terminates in a first slot end, and the second portion of the first slot terminates in a second slot end that is substantially aligned with the first slot end so that the first slot end is substantially aligned with the capillary tube when the capillary tube is in contact with the second slot end.

9. A capillary threading tool, comprising:
    a handle; and
    a body portion connected to the handle, the body portion having formed therein a first slot opening at a first surface of the body portion, a second slot opening at the first surface of the body portion, the second slot being perpendicular to the first slot to divide the first slot into first and second slot sections that terminate at respective first and second slot ends, the first slot section having a width that is smaller than a width of the second slot section.

10. The capillary threading tool of claim 9, further comprising an inclined surface formed at the first slot end, the inclined surface sloping from the first slot end toward the second slot section.

11. The capillary threading tool of claim 10 wherein the inclined surface comprises an inclined plane.

12. The capillary threading tool of claim 9 wherein the first and second slot ends are substantially aligned with each other.

* * * * *